(12) United States Patent
Takechi et al.

(10) Patent No.: US 10,910,454 B2
(45) Date of Patent: Feb. 2, 2021

(54) DISPLAY DEVICE

(71) Applicant: TIANMA JAPAN, LTD., Kanagawa (JP)

(72) Inventors: Kazushige Takechi, Kawasaki (JP); Hiroshi Tanabe, Kawasaki (JP)

(73) Assignees: TIANMA JAPAN, LTD., Kanagawa (JP); Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/504,420

(22) Filed: Jul. 8, 2019

(65) Prior Publication Data
US 2020/0013838 A1 Jan. 9, 2020

(30) Foreign Application Priority Data
Jul. 9, 2018 (JP) .................. 2018-129752

(51) Int. Cl.
*H01L 27/32* (2006.01)
*H01L 51/52* (2006.01)

(52) U.S. Cl.
CPC ........ *H01L 27/3248* (2013.01); *H01L 27/326* (2013.01); *H01L 51/5215* (2013.01); *H01L 51/5234* (2013.01); *H01L 51/5271* (2013.01)

(58) Field of Classification Search
CPC ............... H01L 27/3248; H01L 27/326; H01L 51/5215; H01L 51/5234; H01L 51/5271
See application file for complete search history.

(56) References Cited

U.S. PATENT DOCUMENTS

| | | | |
|---|---|---|---|
| 2015/0168776 A1* | 6/2015 | Song | H01L 51/5281 349/62 |
| 2016/0103649 A1* | 4/2016 | Yoshitani | G09G 3/3208 345/694 |
| 2016/0260933 A1 | 9/2016 | Park et al. | |
| 2017/0263895 A1 | 9/2017 | Lee et al. | |

\* cited by examiner

*Primary Examiner* — Fernando L Toledo
*Assistant Examiner* — Valerie N Newton
(74) *Attorney, Agent, or Firm* — Sughrue Mion, PLLC

(57) ABSTRACT

A display device includes a substrate, regions on the substrate each including a transparent first and a second regions, one or more light-emitting elements disposed in the second region, and a circular polarizing pattern disposed in front of the pixel regions. Each of the one or more light-emitting elements includes a reflective electrode and a transparent electrode layered one above the other, and a light-emitting film provided between the transparent electrode and the reflective electrode. The light-emitting film is configured to emit light in response to electric current supplied between the reflective electrode and the transparent electrode. The circular polarizing pattern covers the entire reflective electrode when seen from the front of the display device. At least a part of the first region is located within a gap in the circular polarizing pattern when seen from the front of the display device.

10 Claims, 14 Drawing Sheets

DISPLAY DEVICE

CROSS-REFERENCE TO RELATED APPLICATIONS

This Non-provisional application claims priority under 35 U.S.C. § 119(a) on Patent Application No. 2018-129752 filed in Japan on Jul. 9, 2018, the entire content of which is hereby incorporated by reference.

BACKGROUND

This disclosure relates to a display device.

Transparent displays have been proposed that display an image while allowing the background behind the display to be seen. Transparent displays can be used in an automotive window or a store window, for example. Transparent displays can utilize self-light-emitting elements, such as organic light-emitting diode (OLED) elements. An OLED element is a current-driven self-light-emitting element and therefore, does not require backlight. In addition to this, the OLED display element has advantages to achieve low power consumption, wide viewing angle, and high contrast ratio.

A transparent display device has regions that reflect the external light because self-light-emitting elements and pixel circuits are provided. To reduce the reflection of the external light, a component called circular polarizer is known. In typical, a sheet of circular polarizer is bonded to the entire front face of the display device. However, the circular polarizer bonded in such a manner diminishes the transmittance of the transparent regions.

SUMMARY

An aspect of this disclosure is a display device including: a substrate; a plurality of pixel regions on the substrate, each including a transparent first region and a second region different from the first region; one or more light-emitting elements disposed in the second region; and a circular polarizing pattern disposed in front of the plurality of pixel regions. Each of the one or more light-emitting elements includes: a reflective electrode and a transparent electrode layered one above the other; and a light-emitting film provided between the transparent electrode and the reflective electrode. The light-emitting film is configured to emit light in response to electric current supplied between the reflective electrode and the transparent electrode. The circular polarizing pattern covers the entire reflective electrode when seen from the front of the display device. At least a part of the first region is located within a gap in the circular polarizing pattern when seen from the front of the display device.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs. The drawings may exaggerate the sizes and the shapes of the elements for clear understanding of the description.

One of the features of this disclosure is a circular polarizing pattern provided in a transparent display device. Each pixel region of the transparent display device includes a transparent region. The circular polarizing pattern diminishes the reflection of the external light. The circular polarizing pattern is provided to cover the reflective electrodes of self-light-emitting elements. As a result, the external light reflected by the reflective electrodes to be seen by the user is reduced. The transparent region, at least a part thereof, is located within a gap in the circular polarizing pattern, so that the light transmitted through the transparent region is less reduced by the circular polarizing pattern.

Overall Configuration of Transparent Display Device

An overall configuration of transparent display devices in the embodiments is described with reference to FIG. 1. In the following, an organic light-emitting diode (OLED) display device is described as an example of the transparent display device; however, the features of this disclosure are applicable to any self-light-emitting type of display devices other than the OLED display device, such as the quantum dot display device.

In the following description, the side on which the display device displays images for the user or the side on which the image is seen by the user is referred to as front and the opposite side as back. The face on the opposite of the face on the front (or front face) is referred to as rear face or back face. Regarding the substrate provided with light-emitting elements, the side closer to the substrate is referred to as lower side and the side farther from the substrate as upper side.

Figure 1:
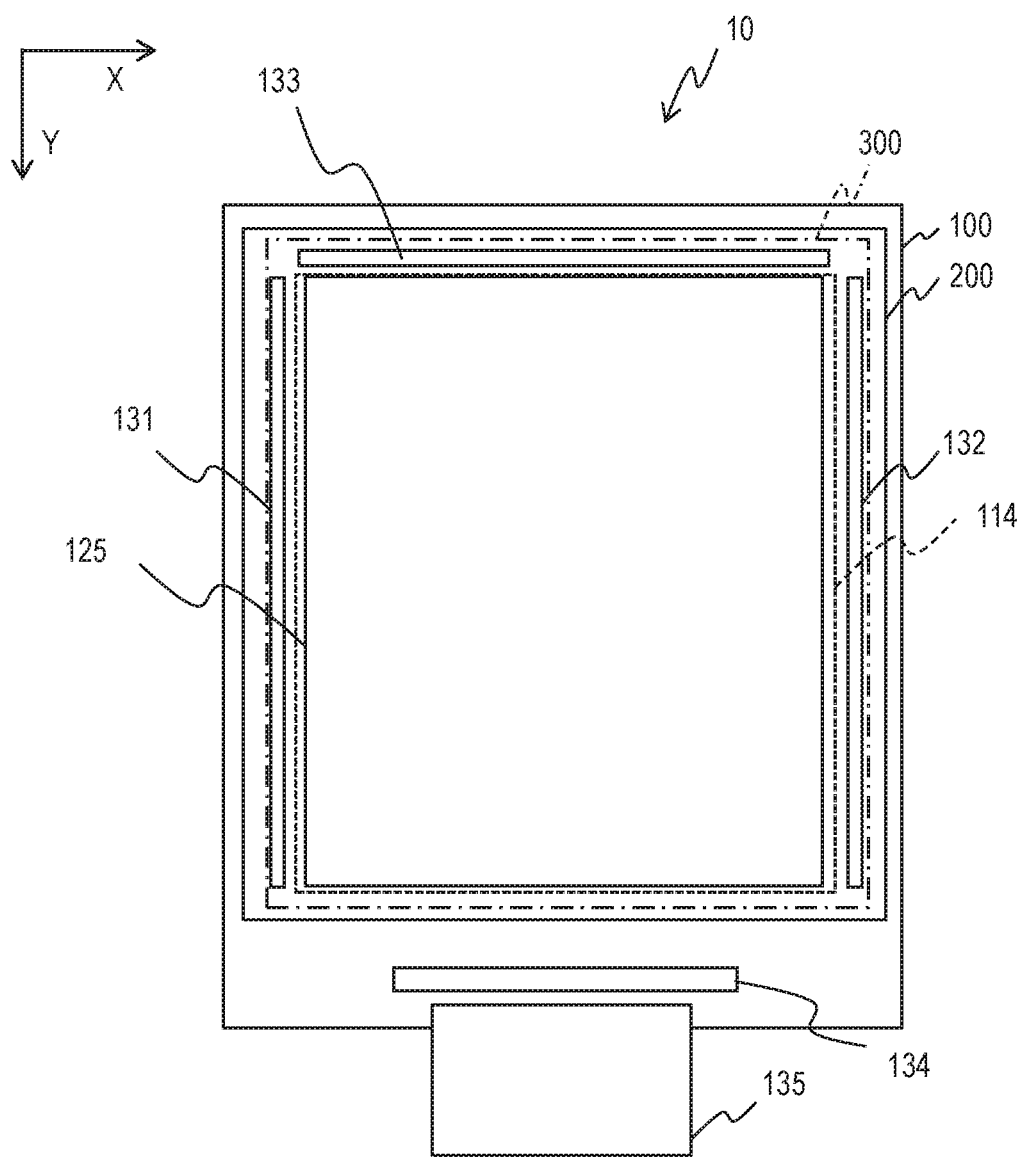
FIG. 1 schematically illustrates a configuration example of an OLED display device.

FIG. 1 schematically illustrates a configuration example of an OLED display device 10. In FIG. 1, the horizontally extending axis is denoted by X-axis and the vertically extending axis by Y-axis. The OLED display device 10 includes an OLED display panel and a control device. The OLED display panel includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200.

The space between the TFT substrate 100 and the encapsulation substrate 200 is filled with dry air and sealed up with the bond 300. As will be described later, an encapsulation film produced with thin film encapsulation (TFE) technology can replace the encapsulation substrate 200. Both of these are structural encapsulation units for encapsulating the elements on the TFT substrate 100.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 has display control functions. The driver IC 134 provides power and timing signals (control signals) to the scanning driver 131 and the emission driver 132 and further, provides signals corresponding to picture data to the data lines.

Hereinafter, a pixel consisting of subpixels of three colors of red (R), green (G), and blue (B) is referred to as main pixel. A subpixel or a main pixel may be referred to as pixel. The features of this disclosure are applicable to display devices having pixels of a color set different from the foregoing three colors and also, black-and-white display devices.

Configuration of Pixel Circuit

Figure 2A:
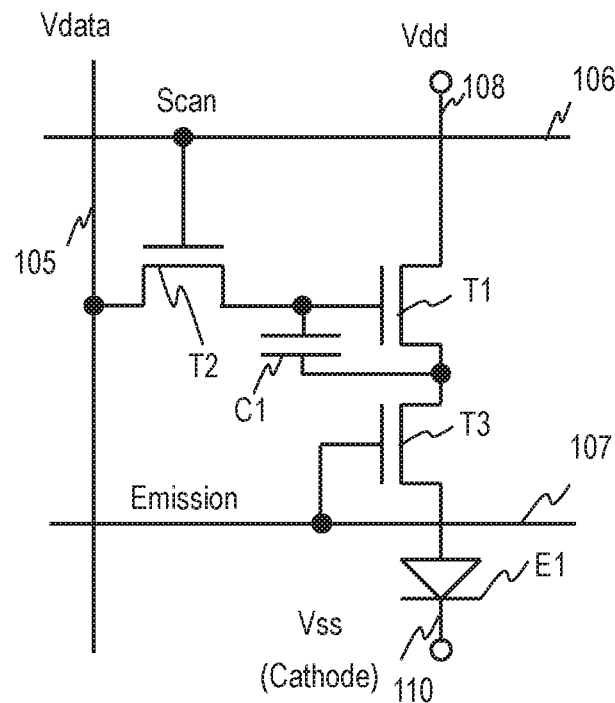
FIG. 2A illustrates a configuration example of a pixel circuit.

A plurality of pixel circuits are formed on the TFT substrate 100 to control the current to be supplied to the anode electrodes of subpixels. FIG. 2A illustrates a configuration example of a pixel circuit. Each pixel circuit includes a first transistor T1, a second transistor T2, a third transistor T3, and a storage capacitor C1. The pixel circuit controls light emission of an OLED element (self-light-emitting element) E1. The transistors are thin film transistors (TFTs). Hereinafter, the first transistor T1 to the third transistor T3 are abbreviated as transistor T1 to transistor T3.

The transistor T2 is a switch for selecting the subpixel. The transistor T2 is an n-channel TFT and its gate terminal is connected with a scanning line 106. The drain terminal is connected with a data line 105. The source terminal is connected with the gate terminal of the transistor T1.

The transistor T1 is a transistor (driving TFT) for driving the OLED element E1. The transistor T1 is an n-channel TFT and its gate terminal is connected with the source terminal of the transistor T2. The drain terminal of the transistor T1 is connected with a power line (Vdd) 108. The source terminal is connected with the drain terminal of the transistor T3. The storage capacitor C1 is provided between the gate terminal and the source terminal of the transistor T1.

The transistor T3 is a switch for controlling the supply/stop of the driving current to the OLED element E1. The transistor T3 is an n-channel TFT and its gate terminal is connected with an emission control line 107. The drain terminal of the transistor T3 is connected with the source terminal of the transistor T1. The source terminal is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the transistor T1 changes in an analog manner in accordance with the stored voltage, so that the transistor T1 supplies a forward bias current corresponding to a light emission level to the OLED element E1. The current flows from the OLED element E1 into the cathode power line (Vss) 110. The cathode power line 110 provides the cathode electrode with a predetermined potential Vss.

The transistor T3 is located on the supply path of the driving current. The emission driver 132 outputs a control signal to the emission control line 107 to control the on/off of the transistor T3. When the transistor T3 is on, the driving current is supplied to the OLED element E1. When the transistor T3 is off, this supply is stopped. The lighting period (duty ratio) in one frame period can be controlled by controlling the on/off of the transistor T3.

Figure 2B:
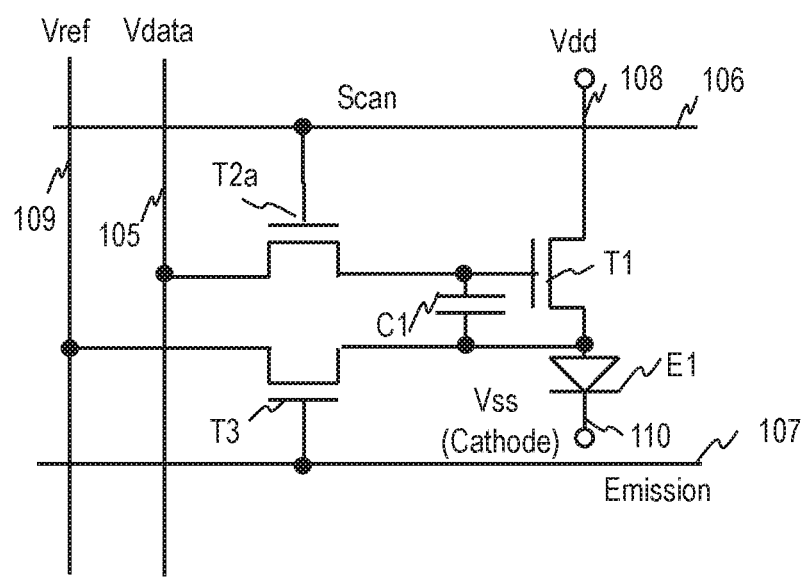
FIG. 2B illustrates another configuration example of a pixel circuit.

FIG. 2B illustrates another configuration example of a pixel circuit. The differences from the pixel circuit in FIG. 2A are the transistor T2a and the transistor T3. The transistor T2a is a switch having the same function as the function of the transistor T2 in FIG. 2A, namely, the switch for selecting the subpixel.

The transistor T3 can be used for various purposes. For example, the transistor T3 can be used to reset the anode electrode of the OLED element E1 once to a sufficiently low voltage that is lower than the black signal level to prevent crosstalk caused by leak current between OLED elements E1.

The transistor T3 can also be used to measure a characteristic of the transistor T1. For example, the voltage-current characteristic of the transistor T1 can be accurately measured by measuring the current flowing from the power line (Vdd) 108 to the reference voltage supply line (Vref) 109 under the bias conditions selected so that the transistor T1 will operate in the saturated region and the switching transistor T3 will operate in the linear region. If the differences in voltage-current characteristic among the transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 109 when the transistor T1 is off and the transistor T3 is operating in the linear region. In the case where the OLED element E1 is deteriorated because of long-term use, for example, if the deterioration is compensated for by generating a data signal at an external circuit, the display device can have a long life spun.

The circuit configurations in FIGS. 2A and 2B are examples; the pixel circuit may have a different circuit configuration. Although the pixel circuits in FIGS. 2A and 2B use n-channel TFTs, the pixel circuit may employ p-channel TFTs.

Configuration of Display Region

Figure 3:
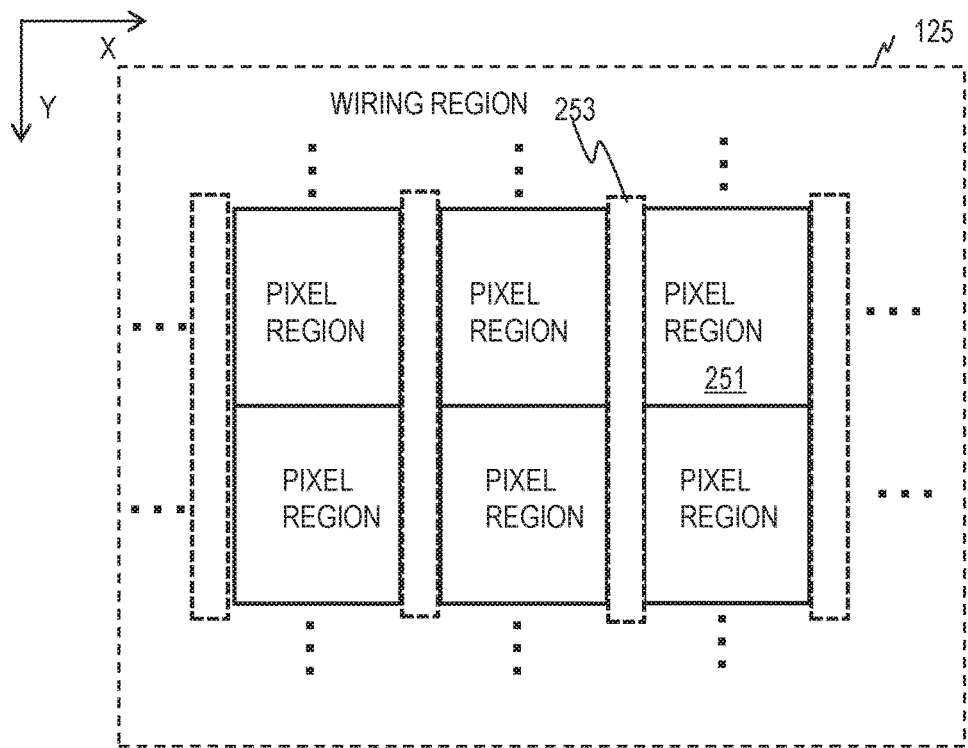
FIG. 3 illustrates a configuration example of a part of a display region.

FIG. 3 illustrates a configuration example of a part of the display region 125. The display region 125 includes a plurality of pixel regions 251 and a plurality of wiring regions 253. In the example of FIG. 3, only one of the pixel regions is provided with a reference sign 251 and only one of the wiring regions is provided with a reference sign 253 by way of example. A pixel region 251 corresponds to one main pixel and includes three colors of light-emitting elements (subpixel regions). The number of light-emitting element per main pixel can be one. A wiring region 253 is a region where lines are disposed.

In the layout example of FIG. 3, the pixel regions 251 are right-angled rectangles and they are disposed in a matrix. In the layout example of FIG. 3, the pixel regions 251 disposed in a line along the Y-axis are continuous without a gap. In the direction along the X-axis, pixel regions 251 and wiring regions 253 are disposed alternately. Each wiring region 253 is located between pixel regions 251 and extends along the Y-axis.

The boundary of a pixel region 251 is defined depending on the relation of subpixel sets adjacent to each other among the cyclically disposed subpixel sets; the boundary can have a rectangular shape or a shape other than a rectangle. The layout of the pixel regions 251 can be different from the example of FIG. 3. The shape and the layout of the wiring regions 253 can also be different from the example of FIG. 3.

Figure 4:
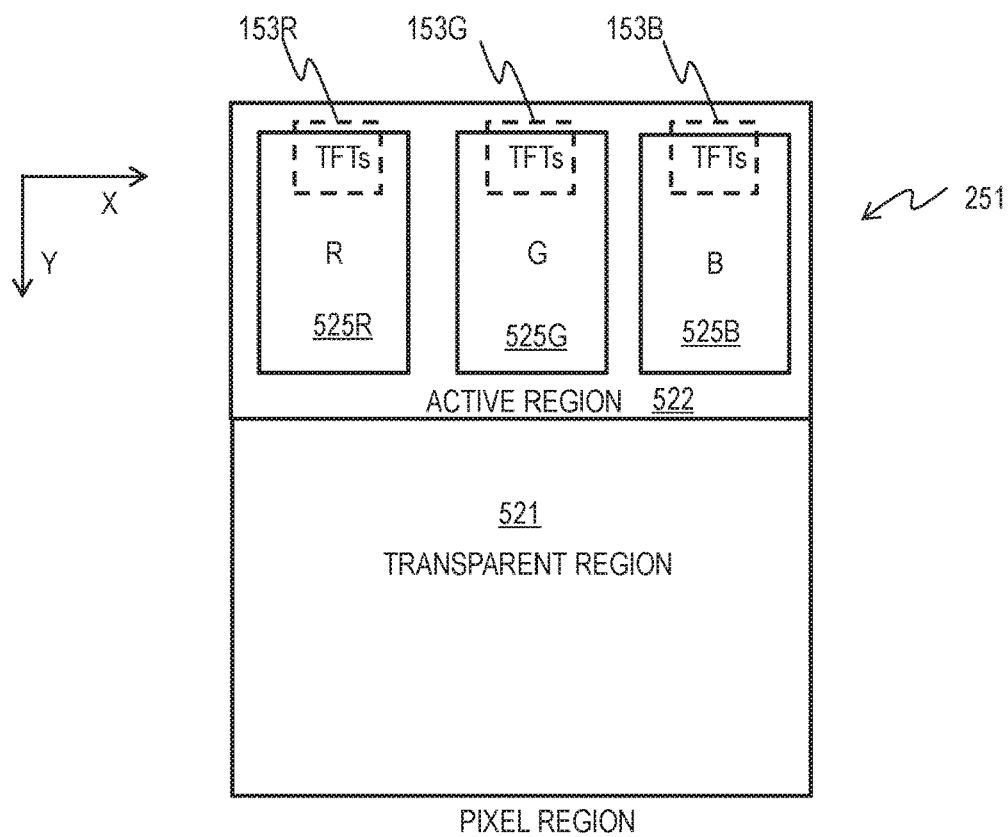
FIG. 4 is a plan diagram schematically illustrating a configuration example of a pixel region.

FIG. 4 is a plan diagram schematically illustrating a configuration example of one pixel region 251. One pixel region 251 consists of a transparent region (first region) 521 and an active region (second region) 522. The active region 522 includes a red subpixel light-emitting region 525R, a green subpixel light-emitting region 525G, and a blue subpixel light-emitting region 525B. These light-emitting regions are regions where an organic light-emitting film supplied with electric current emits light.

In the example of FIG. 4, the shapes (including sizes) of the light-emitting regions 525R, 525G, and 525B are identical but they can be different. The layout of the light-emitting regions 525R, 525G, and 525B is also an example and can be different.

In the pixel region 251, a plurality of sets of TFTs 153R, 153G, and 153B each included in a pixel circuit are disposed. Each set of TFTs corresponds to the TFTs included in a pixel circuit described with reference to FIG. 2A or 2B. In the example of FIG. 4, the sets of TFTs 153R, 153G, and 153B are the TFTs to control driving of the red subpixel light-emitting region 525R, the green subpixel light-emitting region 525G, and the blue subpixel light-emitting region 525B, respectively; they overlap the light-emitting regions associated therewith.

The layout of the TFTs to control driving of the subpixel light-emitting regions depends on the design. Some TFTs disposed in a pixel region 251 may control driving of an organic light-emitting element disposed outside the pixel region 251. The TFTs in a top-emission OLED display device usually overlap light-emitting regions as shown in FIG. 4; however, the TFTs in a bottom-emission OLED display device are disposed outside the light-emitting regions without any overlap as will be described later.

The transparent region 521 transmits visible light from behind the display panel toward the front. The user is in front of the OLED display device 10 to see the displayed image. Since every pixel region 251 includes a transparent region 521, the user recognizes the whole display region 125 as a transparent region through which the user can see behind the display panel.

The active region 522 is a region outside the transparent region 521 in a pixel region 251. As described above, the OLED elements (EL) and the plurality of TFTs in the pixel circuits are disposed in the active region 522.

Various Examples of Structure

Figure 5:
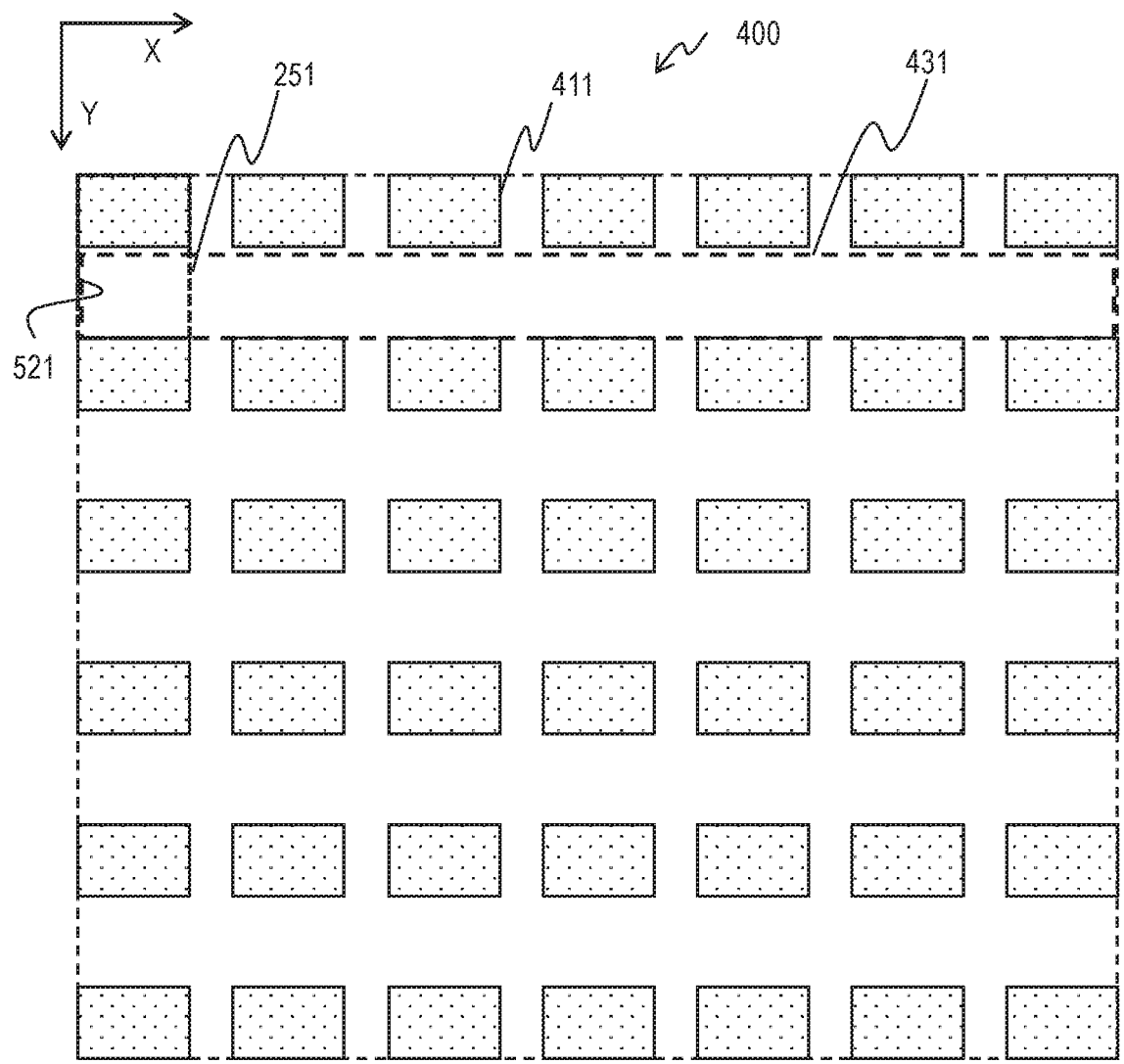
FIG. 5 illustrates a configuration example of a circular polarizing pattern.

FIG. 5 illustrates a configuration example of a circular polarizing pattern. A circular polarizing pattern 400 is a pattern having a circular polarizing function and has a gap 431 therein. The circular polarizing pattern 400 is composed of a plurality of parts 411 having the circular polarizing function. This disclosure refers to the parts 411 as circular polarizing elements.

The circular polarizing pattern 400 is provided in front of the display region 125. The circular polarizing pattern 400 (circular polarizing elements 411) transforms external light to circularly polarized light and blocks (absorbs) the circularly polarized external light reflected off the internal elements. The circular polarizing pattern 400 (circular polarizing elements 411) partially transmits light emitted from the internal light-emitting elements EL and external light coming from behind the OLED display device 10.

In FIG. 5, the circular polarizing elements 411 are like islands and distant from one another. In other words, each circular polarizing element 411 is surrounded by the gap 431. The circular polarizing elements 411 are disposed in a matrix. In FIG. 5, only one of the circular polarizing elements is provided with a reference sign 411 and a part of the internal gap of the circular polarizing pattern is indicated by a dashed line and provided with a reference sign 431. FIG. 5 provides merely an example of the shape and the layout of the circular polarizing elements; the circular polarizing elements can have a different shape and be disposed in a different layout.

Figure 6:
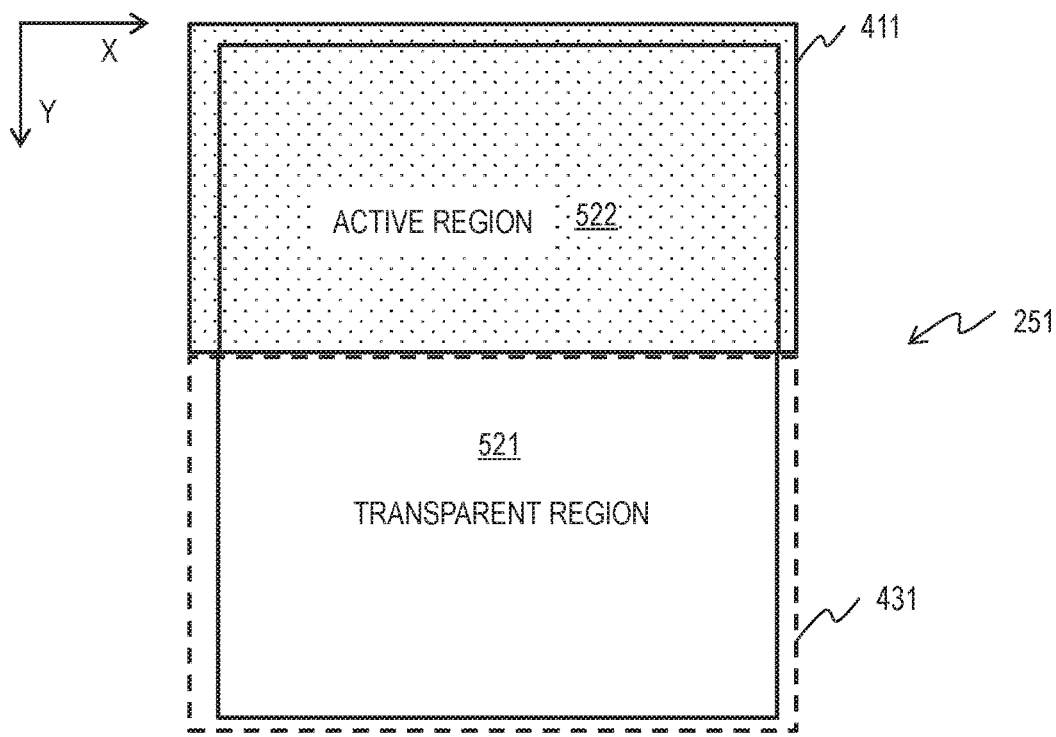
FIG. 6 illustrates an example of the positional relation of a circular polarizing pattern (a circular polarizing element and a gap) to a pixel region.

FIG. 6 illustrates an example of the positional relation of the circular polarizing pattern 400 (a circular polarizing element 411 and the gap 431) to a pixel region 251. A circular polarizing element 411 included in the circular polarizing pattern 400 covers the entirety of the active region 522 in a planar view. The circular polarizing element 411 is on the front of the pixel region 251. The circular polarizing element 411 covers the entirety of the active region 522 when seen from the front of the OLED display device 10.

The active region 522 includes light-emitting regions 525R, 525G, and 525B. The anode electrodes for the light-emitting regions 525R, 525G, and 525B are also disposed in the active region 522. In other words, the anode electrodes are included in the active region 522 when seen from the front of the OLED display device 10 (in a planar view). The anode electrodes in a top-emission OLED display device are reflective electrodes that reflects the external light.

The circular polarizing element 411 in the example of FIG. 6 covers the entirety of the active region 522. Accordingly, when seen from the front of the OLED display device 10, the entirety of all anode electrodes for the light-emitting regions 525R, 525G, and 525B are covered with the circular polarizing element 411. The circular polarizing element 411 blocks the external light reflected off all anode electrodes within the active region 522.

As illustrated in FIGS. 5 and 6, the entirety of the transparent region 521 of a pixel region 251 is included in the gap 431 of the circular polarizing pattern 400. The circular polarizing pattern 400 partially blocks the light from behind the OLED display device 10. Since the circular polarizing element 411 is provided only outside the transparent region 521 and the entire transparent region 521 is located within the gap 431, the transparent region 521 is free from the reduction in transmittance caused by the circular polarizing pattern 400.

The circular polarizing element 411 can overlap the transparent region 521 when seen from the front of the OLED display device 10. In that case, the transparent region 521 is also overlapped by the gap 431 of the circular polarizing pattern 400. When seen from the front of the OLED display device 10, at least a part of the transparent region 521 is included in the gap 431 of the circular polarizing pattern 400. Accordingly, the reduction in transmittance of the transparent region 521 caused by the circular polarizing pattern 400 can be made small.

Figure 7:
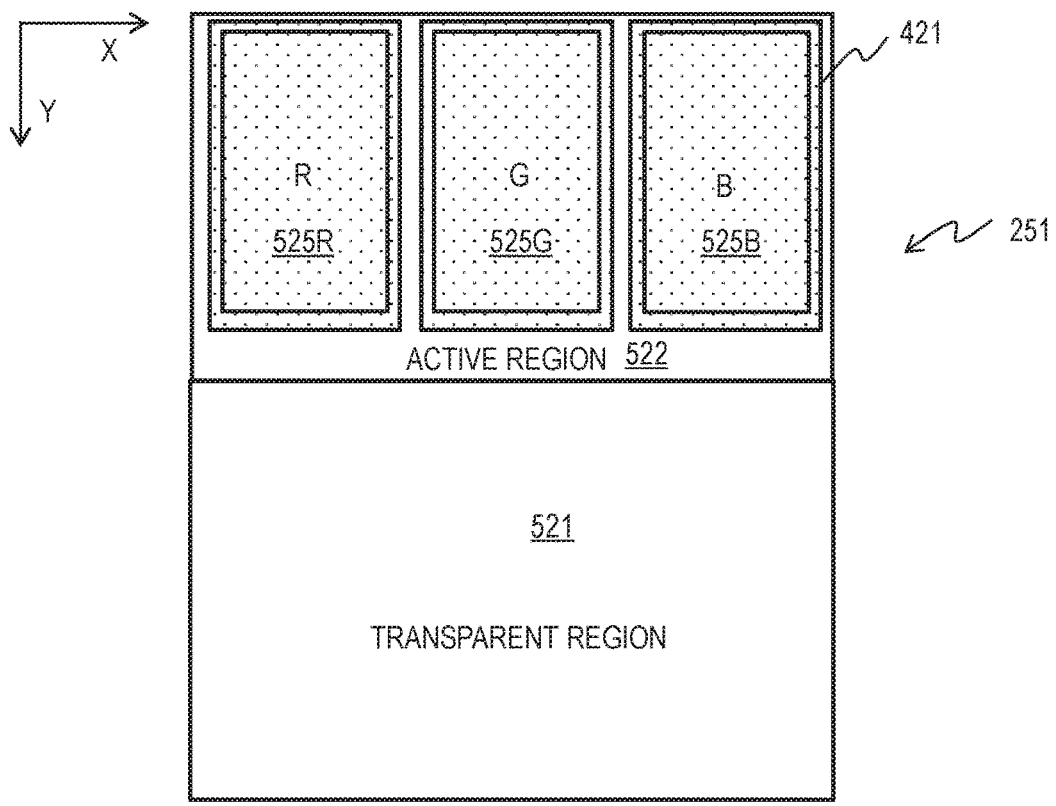
FIG. 7 illustrates another example of the positional relation of a circular polarizing pattern to a pixel region.

FIG. 7 illustrates another example of the positional relation of a circular polarizing pattern to a pixel region 251. FIG. 7 includes some of the circular polarizing elements 421 included in the circular polarizing pattern. In FIG. 7, only one of the circular polarizing elements is provided with a reference sign 421 by way of example. Although FIG. 7 does not explicitly indicate the gap of the circular polarizing pattern, the entire region outside the circular polarizing elements 421 is the gap of the circular polarizing pattern.

Three separate circular polarizing elements 421 each cover a part of the active region 522 when seen from the front of the OLED display device 10. Specifically, the circular polarizing elements 421 individually cover the light-emitting regions 525R, 525G, and 525B and their peripheral areas. As will be described later, each light-emitting region is located within an anode electrode in a planar view. That is to say, the light-emitting region is included in the region defined by the shape of an anode electrode. The periphery of an anode electrode surrounds a light-emitting region and the entire light-emitting region is an overlap with the anode electrode.

The circular polarizing elements 421 in FIG. 7 cover the entire anode electrodes of the light-emitting regions 525R, 525G, and 525B when seen from the front of the OLED display device 10. The periphery of a circular polarizing element 421 coincides with or is outer than the periphery of an anode electrode. The circular polarizing elements 421 block the external light reflected off all anode electrodes within the active region 522.

As illustrated in FIG. 7, the entire region of every circular polarizing element 421 is included in the active region 522 when seen from the front of the OLED display device 10. The circular polarizing element 421 is disposed outside the transparent region 521 and does not overlap the transparent region 521 at all when seen from the front of the OLED display device 10. The entire transparent region 521 of the pixel region 251 is included in the gap of the circular polarizing pattern. Accordingly, the transparent region 521 is free from the reduction in transmittance caused by the circular polarizing pattern. The circular polarizing elements 421 may overlap the transparent region 521.

Figure 8:
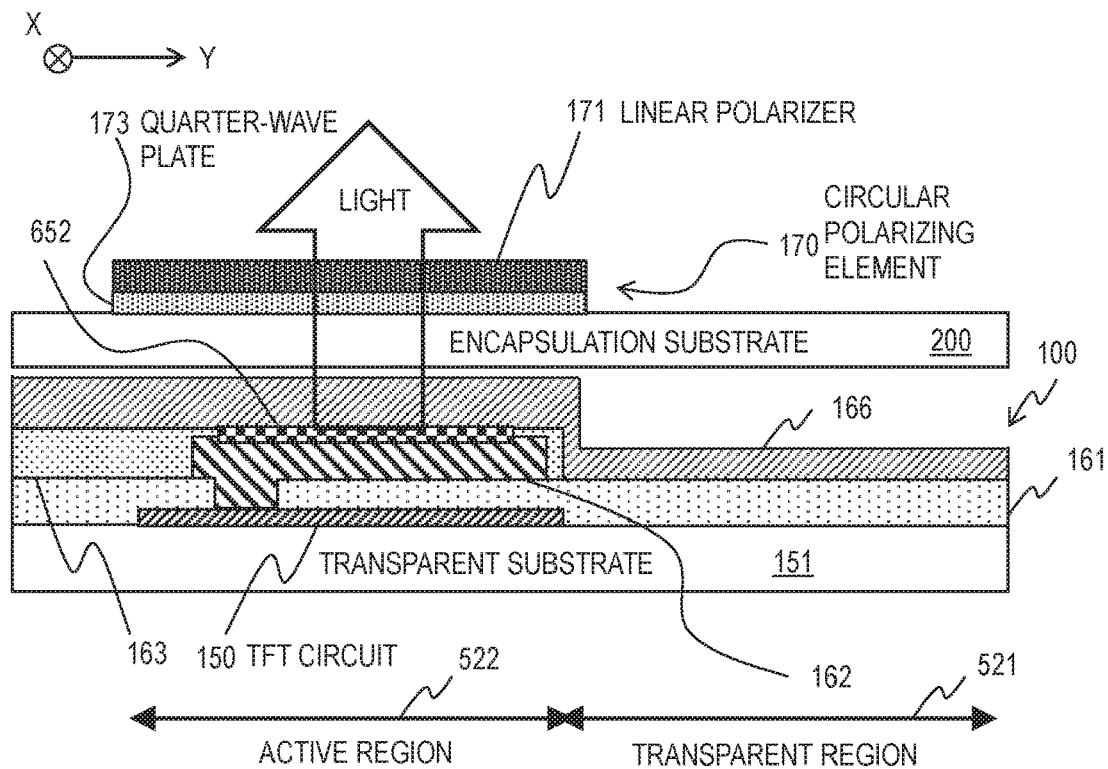
FIG. 8 schematically illustrates an example of the cross-sectional structure of an OLED display device.

FIG. 8 schematically illustrates an example of the cross-sectional structure of an OLED display device 10, particularly, the cross-sectional structure of a part of a transparent region 521 and a part of an active region 522 in a pixel region 251. One OLED element is included within the active region 522. The OLED display device 10 includes an anode electrode 162 of a lower electrode, a cathode electrode 166 of an upper electrode, and an organic light-emitting film 652 on an insulative transparent substrate 151.

The structure in FIG. 8 transmits the light emitted by the organic light-emitting film 652 toward the opposite side of the transparent substrate 151. The transparent substrate 151 can be a rigid glass substrate. The anode electrode 162 is a reflective electrode that reflects the light from the organic light-emitting film 652. The anode electrode 162 includes three layers of a transparent film made of ITO, IZO, ZnO, $In_2O_3$, or the like, a reflective film made of a metal such as Ag, Mg, Al, Pt, Pd, Au, Ni, Nd, Ir, or Cr or an alloy of such a metal, and another transparent film as described above.

The cathode electrode 166 is a transparent electrode that transmits the light from the organic light-emitting film 652 toward an encapsulation substrate 200. The transparent cathode electrode 166 is formed by vapor-depositing Li, Ca, LiF/Ca, LiF/Al, Al, or Mg, for example. The transparent cathode electrode 166 can include a layer of ITO.

In FIG. 8, the cathode electrode 166 is formed to cover the entire display region 125. The anode electrode 162 is formed separately for the subpixel. Part of the light from the organic light-emitting film 652 is reflected by the anode electrode 162, passes through the cathode electrode 166 and the encapsulation substrate 200, and goes out from the display surface of the display device 10. In another structure, the anode electrode can be an upper transparent electrode and the cathode electrode can be a lower reflective electrode.

A TFT circuit 150 for controlling driving of the light-emitting element is provided on a layer between the anode electrode 162 and the transparent substrate 151. An insulative planarization film 161 is provided over the TFT circuit 150. An anode electrode 162 is provided on the insulative planarization film 161. The anode electrode 162 is connected with the source or drain electrode of a driving TFT in the TFT circuit 150 through a contact provided in a contact hole of the planarization film 161.

Above the anode electrode 162, an insulative pixel defining layer (PDL) 163 is provided to separate OLED elements. An OLED element includes an anode electrode 162, an organic light-emitting film 652, and a cathode electrode 166 layered one above another. Openings of the pixel defining layer 163 define the light-emitting regions of individual subpixels.

The organic light-emitting film 652 is provided between the cathode electrode 166 and the anode electrode 162. A not-shown hole supply film can be provided between the anode electrode 162 and the organic light-emitting film 652. The hole supply film can be composed of a hole injection layer and a hole transport layer or alternatively, one or more layers having the functions of those layers. A not-shown electron supply film can be provided between the cathode electrode 166 and the organic light-emitting film 652. The electron supply film can be composed of an electron injection layer and an electron transport layer or alternatively, one or more layers having the functions of those layers.

The encapsulation substrate 200 is fixed at a predetermined distance from the TFT substrate 100. The encapsulation substrate 200 is a transparent rigid insulative substrate and can be a glass substrate. A space is held between the TFT substrate 100 and the encapsulation substrate 200 and a gas such as dry air is tightly packed therein. Such an air-tight structure prevents moisture from entering and damaging the organic light-emitting elements.

A circular polarizing element 170 (circular polarizing pattern) is provided on the front face of the encapsulation substrate 200. The circular polarizing element 170 can be provided on the back face of the encapsulation substrate 200. As illustrated in FIG. 8, when seen in the direction normal to the encapsulation substrate 200 (in a planar view), or when seen from the front of the OLED display device 10, the circular polarizing element 170 covers the entire anode electrode 162.

The circular polarizing element 170 includes a quarter-wave plate 173 and a linear polarizer 171 laminated together. The linear polarizer 171 is on the front and the quarter-wave plate 173 is behind the linear polarizer 171. The linear polarizer 171 and the quarter-wave plate 173 have the identical shapes in a planar view and they are stacked one on the other.

The linear polarizer 171 transmits only polarized light (linearly polarized light) parallel to the polarizing axis out of the incident external light. The quarter-wave plate 173 transforms the linearly polarized incident light into circularly polarized light. The circularly polarized light from the quarter-wave plate 173 partially reflects off the anode electrode 162. The reflection off the anode electrode 162 is circularly polarized light rotated inversely to the incident light. The reflection passes through the quarter-wave plate 173 to become linearly polarized light. This linearly polarized light is perpendicular to the polarizing axis of the linear polarizer 171 and therefore, absorbed by the linear polarizer 171.

The circular polarizing element 170 transmits light emitted from the organic light-emitting film 652. Since the circular polarizing element 170 includes a linear polarizer 171, it partially blocks (absorbs) the light incident from behind. In the configuration example of FIG. 8, the circular polarizing element 170 overlaps the transparent region 521 but most of the transparent region 521 is not covered by the circular polarizing element 170. Accordingly, the reduction by the circular polarizing element 170 of the light transmitted through the transparent region 521 can be made small.

Figure 9:
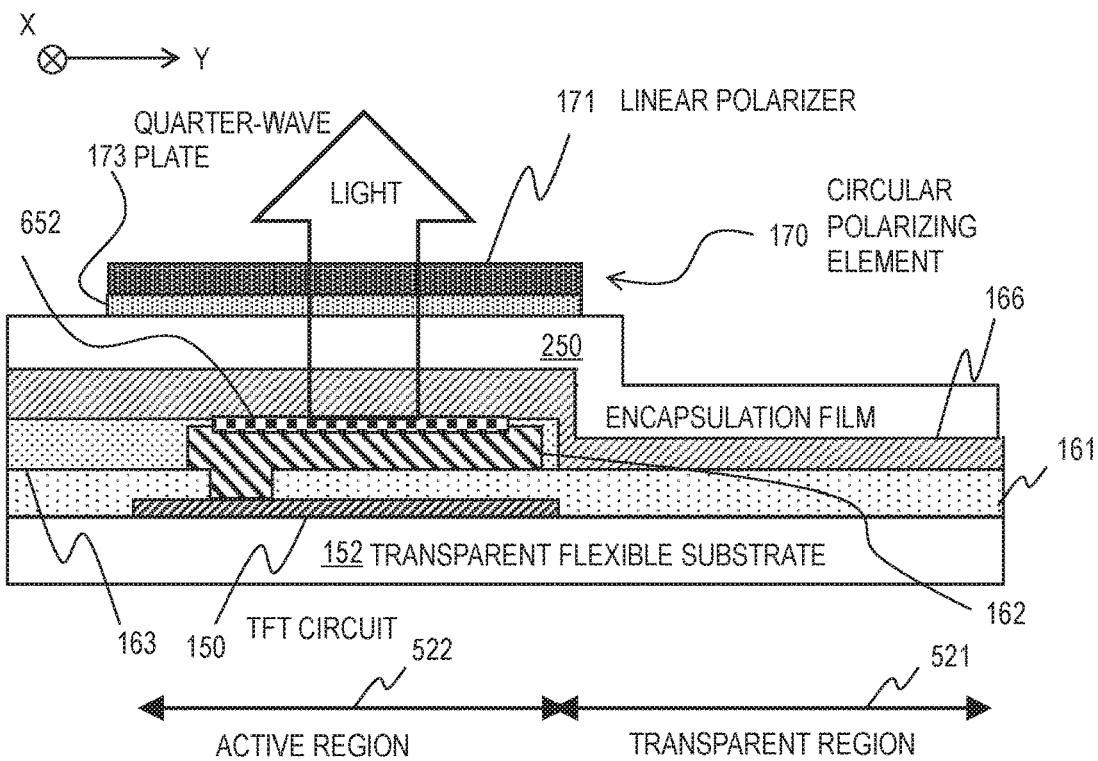
FIG. 9 illustrates an example of the structure of an OLED display device including a structural encapsulation unit different from an encapsulation substrate.

FIG. 9 illustrates an example of the structure of an OLED display device 10 including a structural encapsulation unit different from the encapsulation substrate 200. Differences from the structure example illustrated in FIG. 8 are mainly described. The structure in FIG. 9 includes a transparent flexible substrate 152 in place of the rigid transparent substrate 151. The transparent flexible substrate 152 can be made of polyimide. Although omitted in FIG. 9, a barrier layer is provided between the layer of the TFT circuit 150 and the transparent flexible substrate 152. The barrier layer can be made of silicon nitride.

The structural encapsulation unit is an encapsulation film 250 produced with thin film encapsulation technology. The encapsulation film 250 has a laminate structure of inorganic films and organic films. For example, the encapsulation film 250 include a plurality of inorganic films and a plurality of organic films layered alternately. The inorganic films are barrier films to prevent oxygen or moisture from entering and can be made of silicon nitride or aluminum oxide. Each inorganic film has a thickness of approximately 10 nm. The organic films are planarization resin films. Each organic film can be acrylic resin having a thickness of approximately 2 µm.

The encapsulation film 250 is laminated over the transparent flexible substrate 152. The encapsulation film 250 is formed on the surface of the cathode electrode 166. The inorganic films can be formed by plasma chemical vapor deposition (CVD), physical vapor deposition (PVD), or atomic layer deposition (ALD).

A circular polarizing element 170 is disposed on the front face of the encapsulation film 250. This structure can reduce the damage onto the OLED elements in forming the circular polarizing pattern. The circular polarizing element 170 consists of a linear polarizer 171 and a quarter-wave plate 173 having identical shapes in a planar view. When seen from the front of the OLED display device 10, the circular polarizing element 170 covers the entire anode electrode 162.

The circular polarizing element 170 absorbs external light that comes from the front of the OLED display device 10 and reflects off the anode electrode 162. Most of the transparent region 521 is not covered with the circular polarizing element 170, so that the reduction by the circular polarizing element 170 of the light transmitted through the transparent region 521 can be made small.

Figure 10:
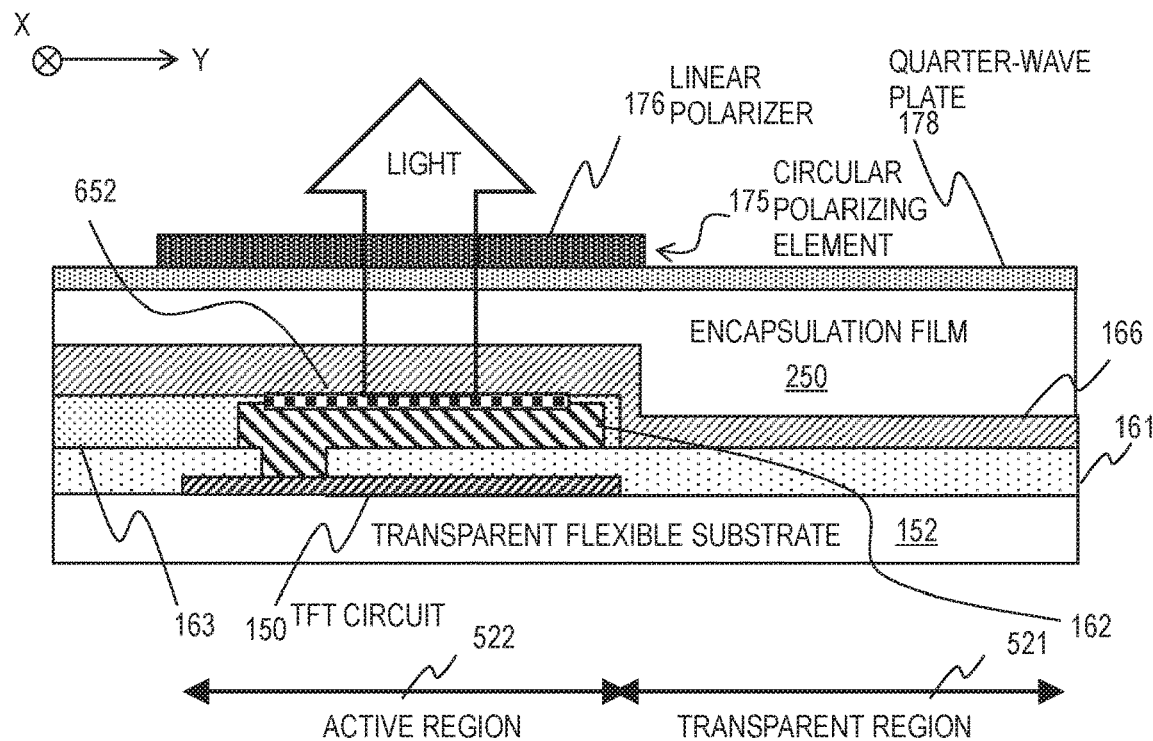
FIG. 10 illustrates another example of the structure of an OLED display device.

FIG. 10 illustrates another example of the structure of an OLED display device 10. Differences from the structure example illustrated in FIG. 9 are mainly described herein. The OLED display device 10 includes a quarter-wave plate 178 covering the entire display region 125 and a plurality of separate linear polarizers 176 (a linear polarizing pattern). One circular polarizing element 175 is composed of one linear polarizer 176 and a part of the quarter-wave plate 178 that is an overlap with the linear polarizer 176. The quarter-wave plate 178 may cover the entire encapsulation film 250.

As described above, each linear polarizer 176 covers an entire anode electrode 162 or an entire active region 522 when seen from the front of the OLED display device 10. The linear polarizer 176 overlaps a transparent region 521 but most of the transparent region 521 is not covered with the linear polarizer 176.

The quarter-wave plate 178 works as a barrier film against a chemical in wet process for patterning linear polarizers 176 at desired locations to reduce the wet damage onto the OLED elements or the encapsulation film 250. Since the quarter-wave plate 178 is thin and does not reduce the light transmitted therethrough as much as the linear polarizer 176, the effect of the quarter-wave plate 178 onto the light transmitted through the transparent region 521 is small.

Figure 11:
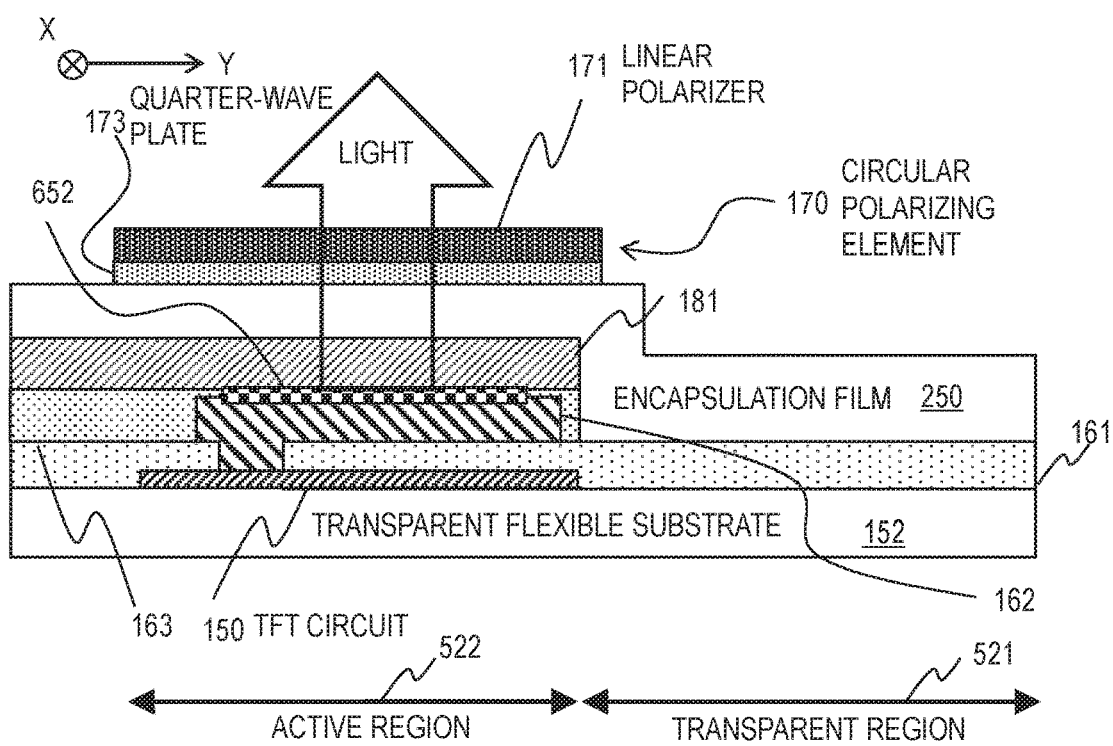
FIG. 11 illustrates still another example of the structure of an OLED display device.

FIG. 11 illustrates still another example of the structure of an OLED display device 10. Differences from the structure example illustrated in FIG. 9 are mainly described herein. In the structure example in FIG. 11, the cathode electrode 181 is patterned to avoid overlapping the transparent region 521. This structure increases the amount of light to be transmitted through the transparent region 521. Furthermore, the cathode electrode 181 is thickened to attain cavity effects of the OLED element. For example, the cathode electrode 181 for each subpixel can be shaped like an island or can be a part of a strip-like cathode electrode. The cathode electrode 181 can overlap the transparent region 521.

Figure 12:
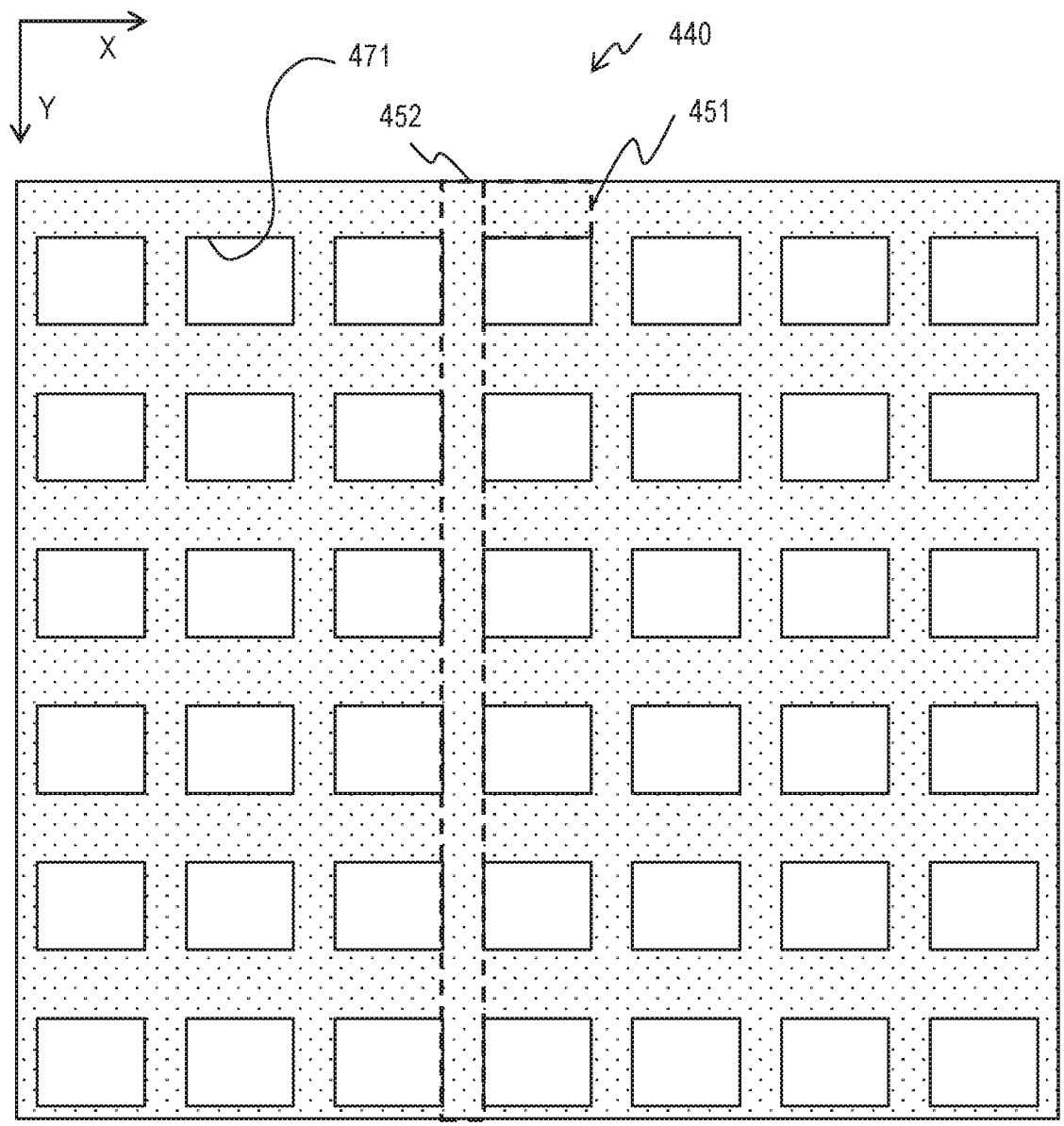
FIG. 12 illustrates a configuration example of a circular polarizing pattern.

FIG. 12 illustrates a configuration example of the circular polarizing pattern. This circular polarizing pattern 440 is unseparated and has a grid-like shape. The circular polarizing pattern 440 has a plurality of separate gaps 471 therein. Only one of the gaps in the circular polarizing pattern 440 is provided with a reference sign 471 by way of example. The circular polarizing pattern 440 is composed of unseparated circular polarizing elements.

In FIG. 12, two kinds of circular polarizing elements 451 and 452 are indicated by dashed lines. Only one each of the two kinds of the circular polarizing elements are provided with reference signs 451 and 452. A circular polarizing element 451 is a part covering the active region of a pixel region and a circular polarizing element 452 is a part covering a wiring region of the TFT substrate 100.

The circular polarizing elements 451 are disposed in a matrix to match with pixel regions. The circular polarizing elements 452 are disposed to extend along the Y-axis between columns of circular polarizing elements 451 disposed along the Y-axis. Each gap 471 is surrounded by two circular polarizing elements 451 and two circular polarizing elements 452.

Figure 13:
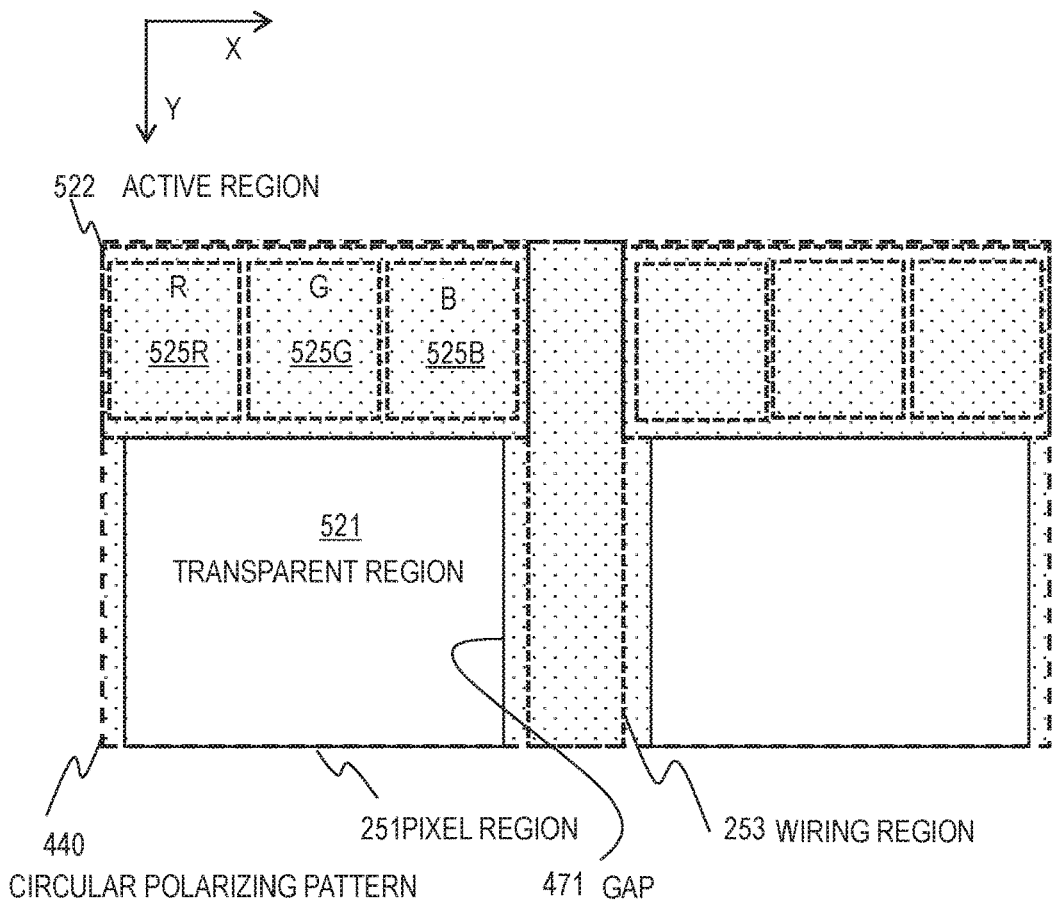
FIG. 13 illustrates an example of the positional relation of a circular polarizing pattern to two pixel regions.

FIG. 13 illustrates an example of the positional relation of the circular polarizing pattern 440 to two pixel regions 251. The circular polarizing pattern 440 covers the entirety of active regions 522 in a planar view. An active region 522 has been described with reference to FIG. 6. More specifically, a circular polarizing element 451 as a part of the circular polarizing pattern 440 covers one entire active region 522. The circular polarizing pattern 440 is located on the front of the pixel region 251. The circular polarizing pattern 440 covers the entire active region 522 when seen from the front of the OLED display device 10.

When seen from the front of the OLED display device 10, the anode electrodes of the light-emitting regions 525R, 525G, and 525B are fully covered with the circular polarizing pattern 440. The circular polarizing element 451 blocks the reflection of the external light off all anode electrodes within the active region 522.

Figure 14:
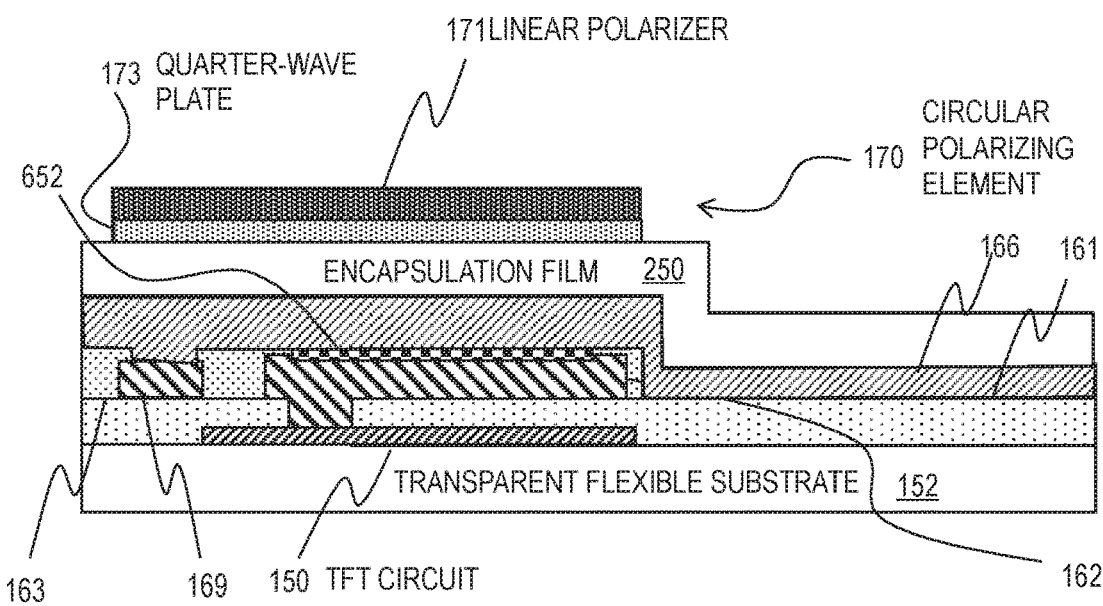
FIG. 14 illustrates an example of the circular polarizing pattern covering auxiliary lines.

The circular polarizing pattern 440 further covers the wiring region 253 between pixel regions 251. Specifically, a circular polarizing element 452 covers the wiring region 253. The wiring region 253 is a region of the TFT substrate 100 where lines lie. In the wiring region 253, lines such as a power line 108 and a line connected with a cathode electrode 181 to supply the cathode potential Vss are provided. Alternatively, an auxiliary line 169 for connecting the cathode electrode 166 covering the entire display region 125 to a cathode power line outside the display region 125 may be provided as illustrated in FIG. 14. The auxiliary line 169 prevents impairment of the display quality because of the cathode resistance.

The power line 108 and the auxiliary line 169 are formed on the same layer as the TFT circuit 150 and made of a metal such as Mo, Al, or Ti, or an alloy of such a metal. For this reason, the lines in the wiring region 253 reflect the external light. The circular polarizing pattern 440 covers all lines within the wiring region 253 to block the reflection of the external light off the lines.

The entire transparent region 521 of a pixel region 251 can be included in a gap 471 of the circular polarizing pattern 440 as illustrated in FIGS. 5 and 6. The circular polarizing pattern 440 blocks part of the light coming from behind the OLED display device 10. Since the circular polarizing pattern 440 exists only outside the transparent region 521 and the entire transparent region 521 exists within the gap 471, the transparent region 521 is free from the reduction in transmittance caused by the circular polarizing pattern 440.

The circular polarizing pattern 440 can overlap the transparent region 521 when seen from the front of the OLED display device 10. In that case, the transparent region 521 is also overlapped by the gap 471 of the circular polarizing pattern 440. When seen from the front of the OLED display device 10, at least a part of the transparent region 521 is included in the gap 471 of the circular polarizing pattern 440. As a result, the reduction in transmittance of the transparent region 521 caused by the circular polarizing pattern 440 can be made small.

The circular polarizing pattern 440 can replace the circular polarizing pattern 400 in any of the structures described with reference to FIGS. 8 to 11.

Figure 15:
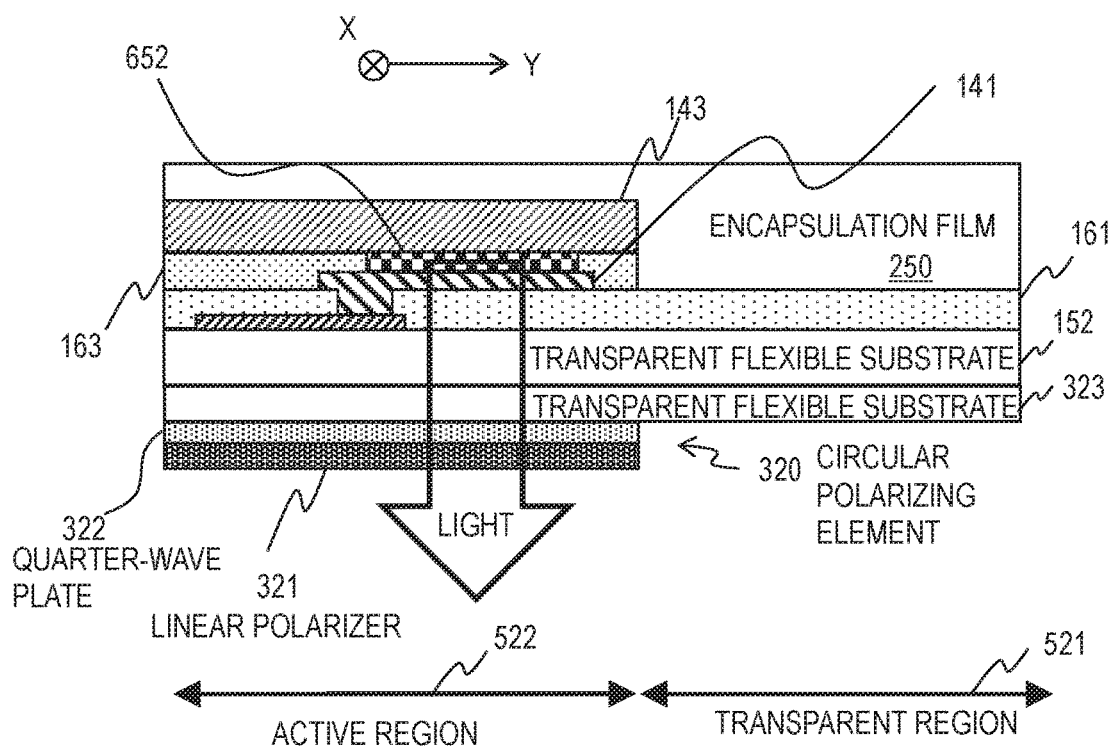
FIG. 15 illustrates an example of the structure of a bottom emission OLED display device.

FIG. 15 illustrates an example of the structure of a bottom-emission OLED display device 10. The front of the OLED display device 10 is located at the bottom of FIG. 15. Differences from the structure illustrated in FIG. 11 are mainly described herein.

The anode electrode 141 is a transparent electrode and is made of ITO, for example. The cathode electrode 143 is a reflective electrode and is made of aluminum, for example. A transparent flexible substrate 323 is attached on the front face of the transparent flexible substrate 152 of the TFT substrate 100. A circular polarizing pattern including a plurality of circular polarizing elements 320 is provided on the front face of the transparent flexible substrate 323. The transparent flexible substrate 323 with the circular polarizing pattern is bonded to the front face of the TFT substrate 100 in correct alignment.

Each circular polarizing element 320 includes a linear polarizer 321 and a quarter-wave plate 322 laminated onto the front face of the transparent flexible substrate 323. The linear polarizer 321 is located on the front and the quarter-wave plate 322 is located behind the linear polarizer 321. The circular polarizing element 320 covers the entire cathode electrode 143 when seen from the front of the OLED display device 10. The transparent flexible substrate 323 can be omitted so that the circular polarizing pattern is formed on the front face of the transparent flexible substrate 152.

Figure 16:
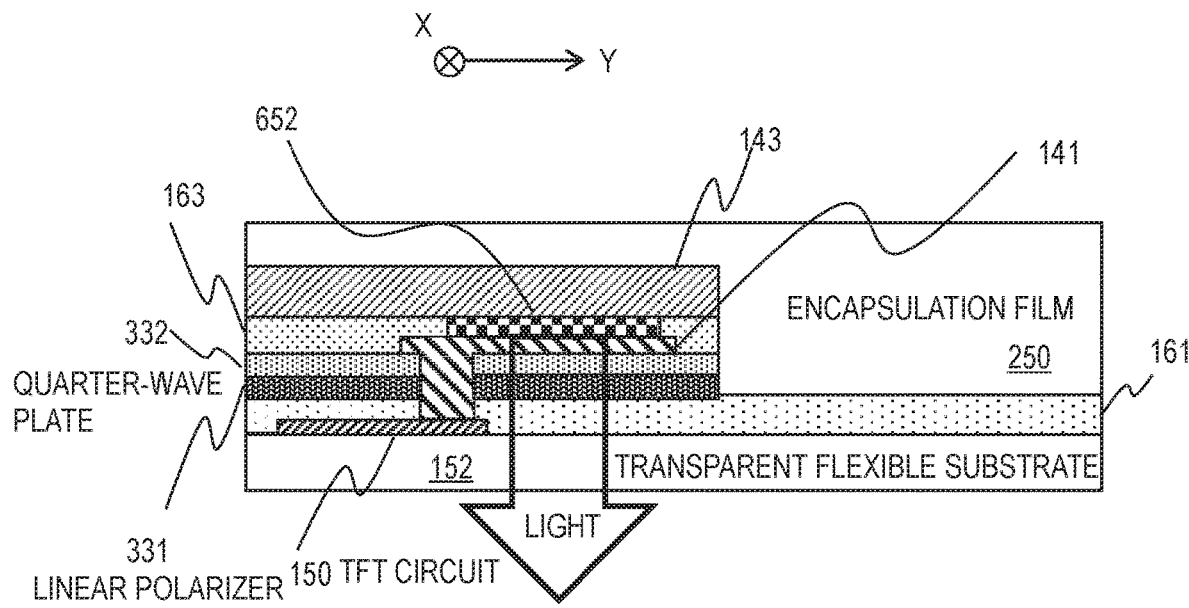
FIG. 16 illustrates another example of the structure of a bottom emission type of OLED display device.

FIG. 16 illustrates another example of the structure of a bottom-emission OLED display device 10. Differences from the structure illustrated in FIG. 15 are mainly described herein. The circular polarizing pattern is provided inside the TFT substrate 100 or between the transparent flexible substrate 152 and the encapsulation film 250. A linear polarizer 331 and a quarter-wave plate 332 are laminated between the planarization film 161 and the anode electrode 141 or between the planarization film 161 and the pixel defining layer 163.

The linear polarizer 331 is located on the front and the quarter-wave plate 332 is located behind the linear polarizer 331. Although a contact between the anode electrode 141 and the TFT circuit 150 is provided through the linear polarizer 331 and the quarter-wave plate 332, the TFT circuit 150 blocks the visible light from the front of the OLED display device 10. Accordingly, when seen from the front of the OLED display device 10, the circular polarizing element consisting of the linear polarizer 331 and the quarter-wave plate 332 covers the entire cathode electrode 143.

In fabricating a TFT array, the linear polarizer 331 and the quarter-wave plate 332 can be formed prior to the organic light-emitting film 652. Accordingly, damage onto the organic light-emitting film 652 caused by formation of the linear polarizer 331 and the quarter-wave plate 332 can be avoided. The circular polarizing patterns illustrated in FIGS. 15 and 16 are applicable to rigid bottom-emission OLED display devices.

Figure 17:
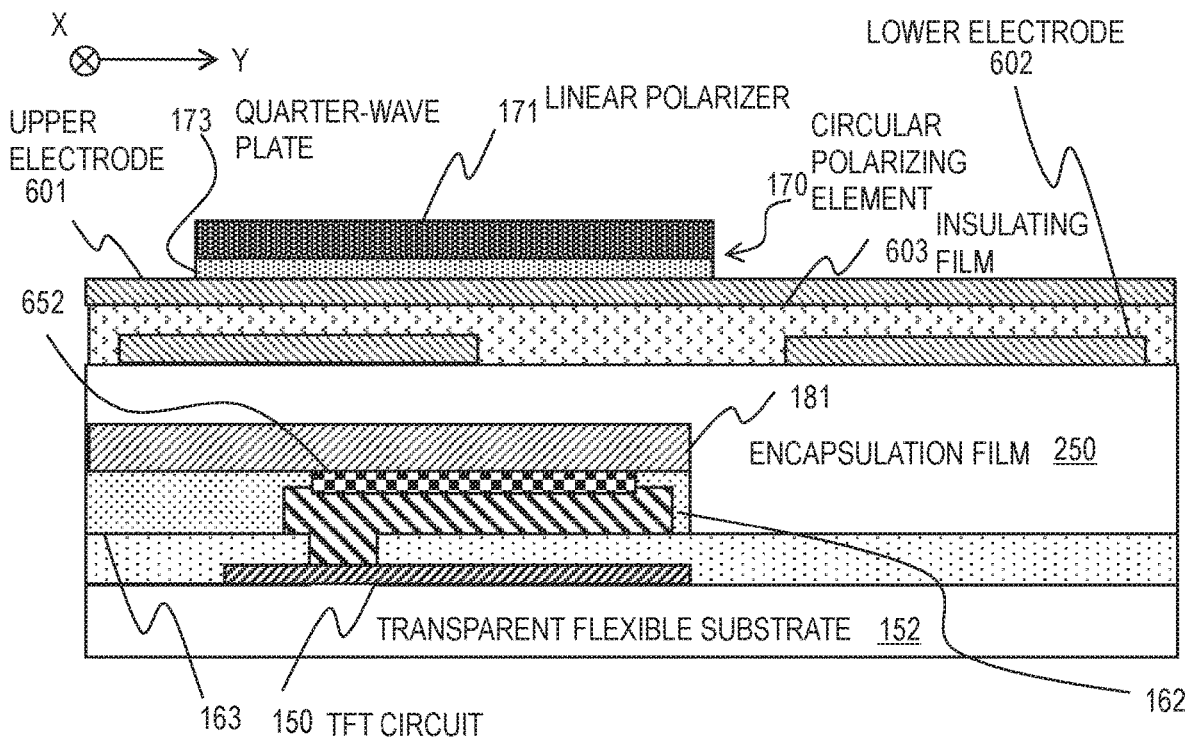
FIG. 17 illustrates another example of the structure of an OLED display device.

FIG. 17 illustrates another example of the structure of an OLED display device. The OLED display device 10 includes a touch sensor. Differences from the structure illustrated in FIG. 11 are mainly described. The touch sensor is disposed on the front face of the encapsulation film 250. The touch sensor includes a plurality of transparent upper electrodes (front electrodes) 601, a plurality of transparent lower electrodes (rear electrodes) 602, and a transparent insulating film 603 between the upper electrodes 601 and the lower electrodes 602. For example, the upper electrodes 601 and the lower electrodes 602 are made of ITO and the insulating film 603 is an organic film.

For example, the plurality of upper electrodes 601 are separately disposed side by side along the X-axis to extend along the Y-axis. The plurality of lower electrodes 602 are separately disposed side by side along the Y-axis to extend along the X-axis. The touch sensor can have any structure; the electrodes can have desired shapes and they can be disposed as desired.

The circular polarizing pattern is laminated on the front face of the touch sensor. Each circular polarizing element 170 consists of a linear polarizer 171 and a quarter-wave plate 173 laminated together. The insulating film 603 of the touch sensor reduces the damage onto the organic light-emitting film 652 caused by formation of the circular polarizing pattern.

Figure 18:
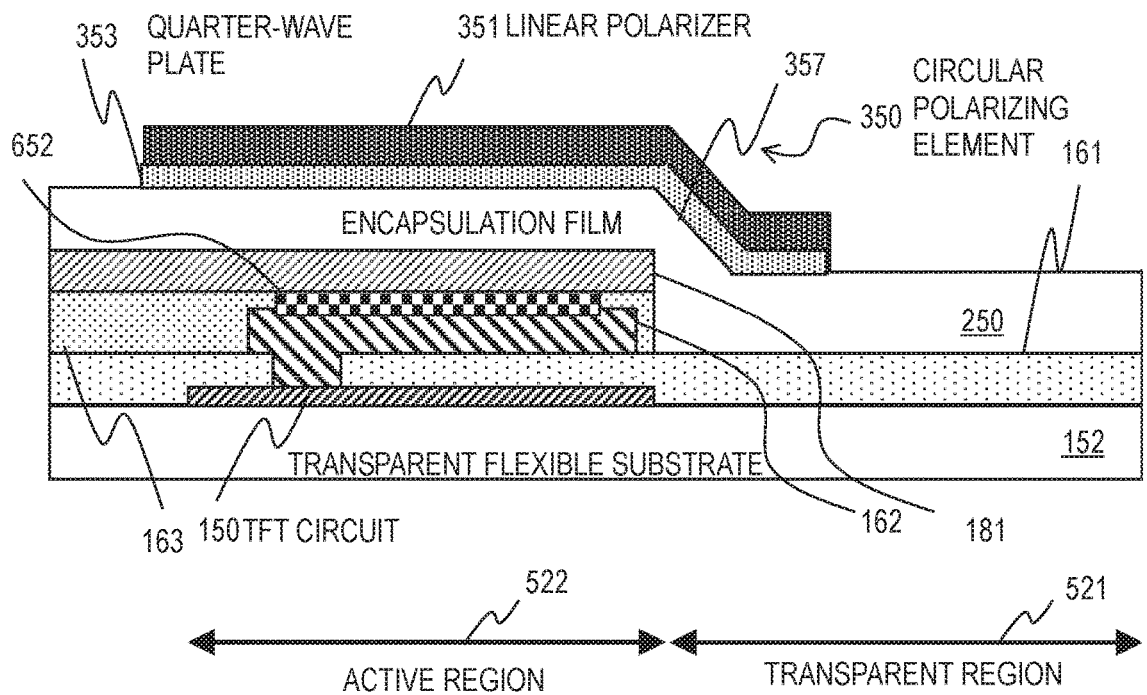
FIG. 18 illustrates still another example of the structure of an OLED display device.

FIG. 18 illustrates still another example of the structure of an OLED display device. Differences from the structure illustrated in FIG. 11 are mainly described. A circular polarizing element 350 covers a step 357 of the encapsulation film 250 provided at the border between the transparent region 521 and the active region 522. Specifically, the laminate of the linear polarizer 351 and the quarter-wave plate 352 covers the step 357. This configuration reduces the possibility that the step 357 cracks.

Method of Forming Circular Polarizing Pattern

Hereinafter, a method of forming the circular polarizing pattern in manufacturing an OLED display device is described. The processes to manufacture the TFT substrate 100, the encapsulation substrate 200, and the encapsulation film 250 can employ known techniques.

Figure 19:
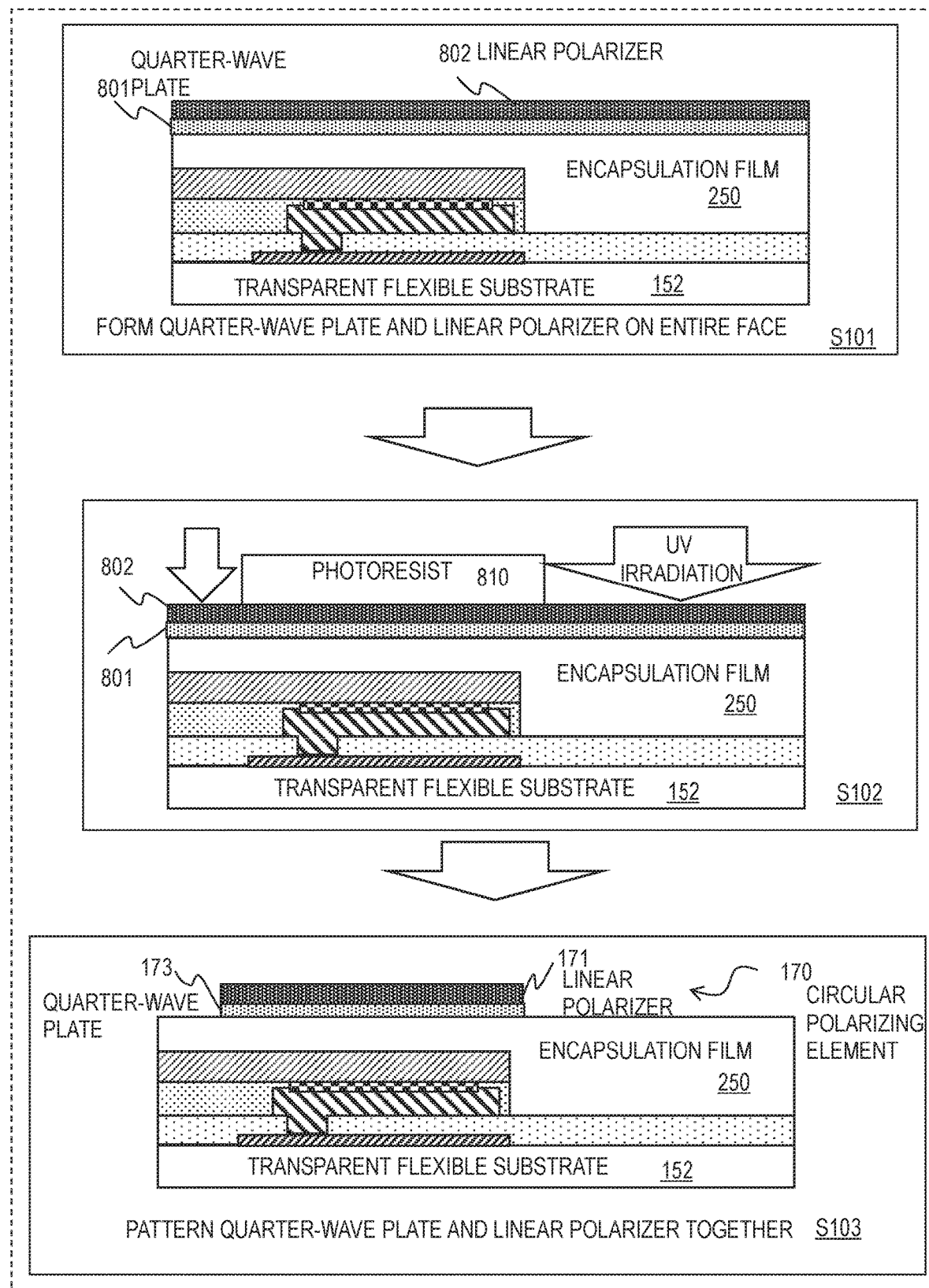
FIG. 19 illustrates an example of forming a circular polarizing pattern.

FIG. 19 illustrates an example of forming a circular polarizing pattern. This method applies the material of a circular polarizer onto the encapsulation film and patterns it to form the circular polarizing pattern. First, the method forms a quarter-wave plate 802 and a linear polarizer 801 on the entire surface of the encapsulation film 250 (S101).

This step first applies photopolymerizable liquid crystal monomer and then polymerizes it by irradiating the film with ultraviolet light to fix the orientation. As a result, a quarter-wave plate 802 is formed on the encapsulation film 250. Next, this step forms a dye linear polarizer 801 on the quarter-wave plate 802 by providing the quarter-wave plate 802 with polyvinyl alcohol (PVA) and dichroic dye in such a manner that the dichroic dye is absorbed and oriented along oriented PVA molecular chains.

Next, the method forms a photoresist pattern 810 on the linear polarizer 801 and irradiates the linear polarizer 801 and the quarter-wave plate 802 with ultraviolet light through the gaps in the photoresist pattern 810 (S102). Further, the method develops the linear polarizer 801 and the quarter-wave plate 802 to form the circular polarizing pattern (circular polarizing elements 170) (S103). The method can use a mask in place of the photoresist pattern at Step S102.

Figure 20:
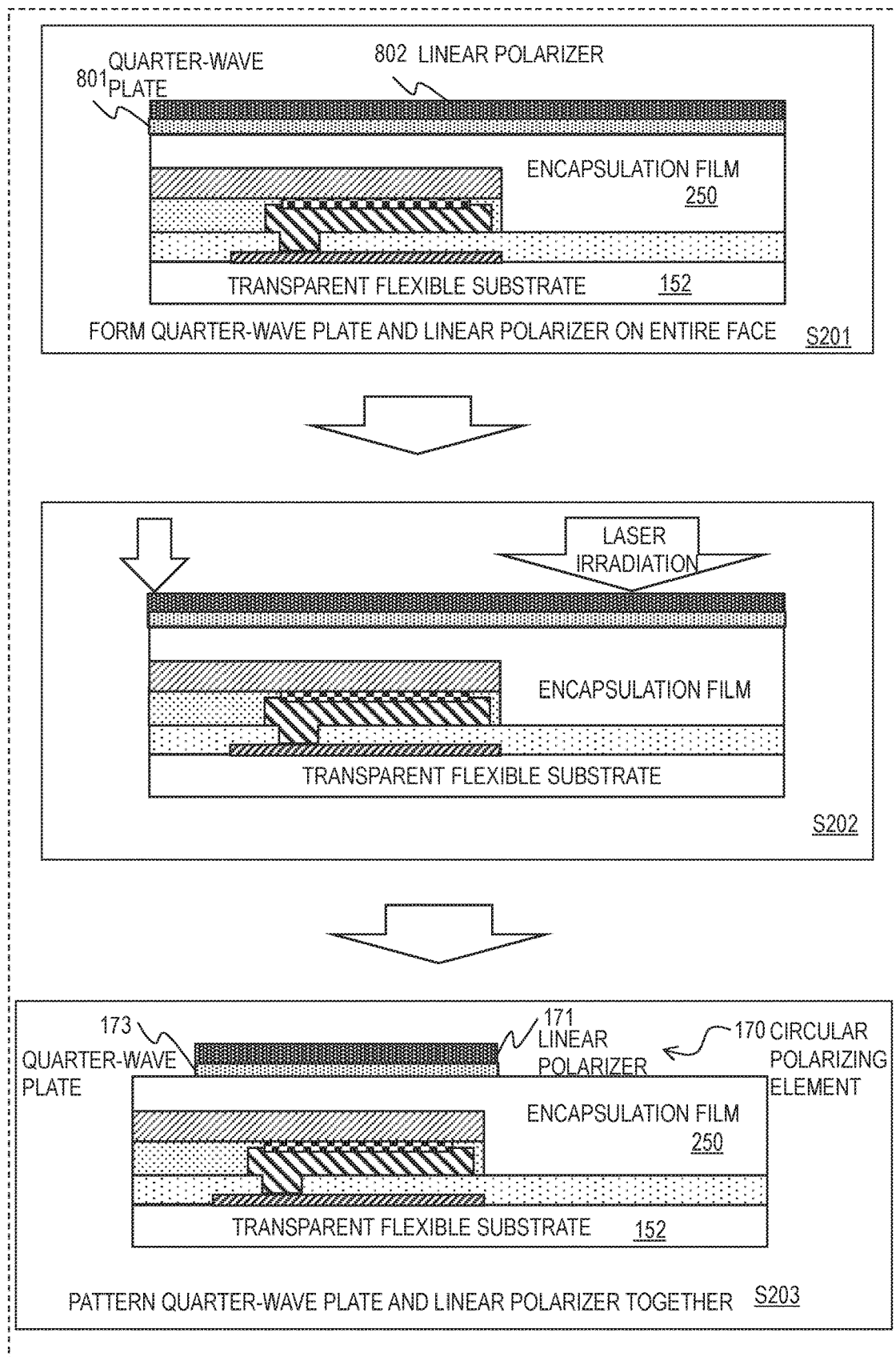
FIG. 20 illustrates another example of forming a circular polarizing pattern.

FIG. 20 illustrates another example of forming a circular polarizing pattern. This method patterns the circular polarizing film on the encapsulation film 250 by laser ablation. The method first forms a quarter-wave plate 802 and a linear polarizer 801 on the entire encapsulation film 250 (S201). This step is the same as Step S101 in FIG. 19. Next, the method irradiates the linear polarizer 801 and the quarter-wave plate 802 with a laser beam (S202) to form the circular polarizing pattern (circular polarizing elements 170) (S203).

Figure 21:
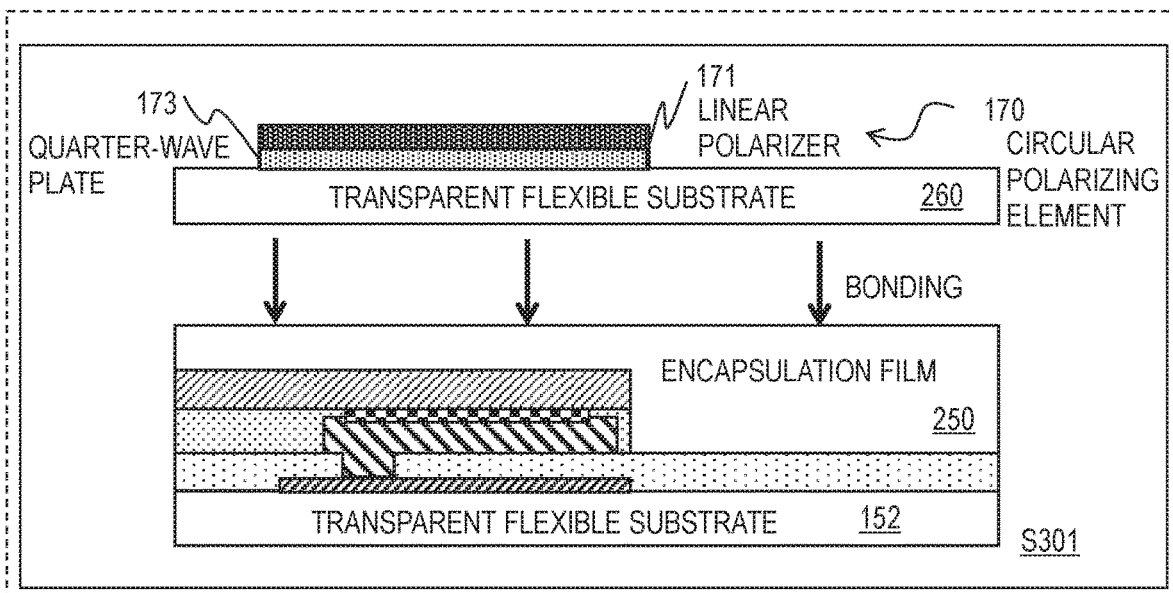
FIG. 21 illustrates still another example of forming a circular polarizing pattern.
Figure 21:

FIG. 21 illustrates still another example of forming a circular polarizing pattern. This method bonds a transparent flexible substrate 260 with a circular polarizing pattern (circular polarizing elements 170) formed thereon onto the front face of the encapsulation film 250 in correct alignment (S301). As a result, the circular polarizing pattern (circular polarizing elements 170) is provided on the front face of the encapsulation film 250 (S302). The circular polarizing pattern (circular polarizing elements 170) are provided on the front face of the transparent flexible substrate 260 and the back face of the transparent flexible substrate 260 is bonded with the front face of the encapsulation film 250.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a substrate;
   a plurality of pixel regions on the substrate, each including a transparent first region and a second region different from the first region;
   one or more light-emitting elements disposed in the second region; and
   a circular polarizing pattern disposed in front of the plurality of pixel regions,
   wherein each of the one or more light-emitting elements includes:
      a reflective electrode and a transparent electrode layered one above the other; and
      a light-emitting film provided between the transparent electrode and the reflective electrode, the light-emitting film being configured to emit light in response to electric current supplied between the reflective electrode and the transparent electrode,
   wherein the circular polarizing pattern covers the entire reflective electrode when seen from the front of the display device, and
   wherein at least a part of the first region is located within a gap without linear polarization in the circular polarizing pattern when seen from the front of the display device.

2. The display device according to claim 1, wherein the entire first region is located within a gap in the circular polarizing pattern when seen from the front of the display device.

3. The display device according to claim 1, further comprising lines extending between pixel regions,
   wherein the circular polarizing pattern covers the lines when seen from the front of the display device.

4. The display device according to claim 1, further comprising an encapsulation film laminated on the substrate in such a manner that the encapsulation film covers the entirety of the plurality of pixel regions to encapsulate the plurality of pixel regions,
   wherein the circular polarizing pattern is disposed on the front face of the encapsulation film.

5. The display device according to claim 4, wherein the circular polarizing pattern includes:
   a quarter-wave plate covering the entirety of the plurality of pixel regions when seen from the front of the display device; and
   a linear polarizing pattern laminated on the front face of the quarter-wave plate.

6. The display device according to claim 4, further comprising a touch sensor between the encapsulation film and the circular polarizing pattern,
- wherein the touch sensor includes a layer of front electrodes, a layer of rear electrodes, and an insulating film disposed between the layer of the front electrodes and the layer of the rear electrodes, and
- wherein the circular polarizing pattern is laminated on the front face of the touch sensor.

7. The display device according to claim 4, wherein the circular polarizing pattern covers a step of the encapsulation film.

8. The display device according to claim 1, further comprising a rigid encapsulation substrate fixed above the substrate in such a manner that the encapsulation substrate covers the entirety of the plurality of pixel regions without touching the one or more light-emitting elements to encapsulate the plurality of pixel regions,
- wherein the circular polarizing pattern is laminated on the front face or the back face of the encapsulation substrate.

9. The display device according to claim 1,
- wherein the transparent electrode is disposed between the reflective electrode and the substrate, and
- wherein the circular polarizing pattern is disposed between the substrate and the transparent electrode.

10. The display device according to claim 1,
- wherein the transparent electrode is disposed between the reflective electrode and the substrate, and
- wherein the circular polarizing pattern is laminated on the front face of the substrate.

* * * * *